United States Patent [19]

Stegherr

[11] Patent Number: 5,004,939
[45] Date of Patent: Apr. 2, 1991

[54] CMOS-ECL CONVERTER

[75] Inventor: Michael Stegherr, Neubiberg, Fed. Rep. of Germany

[73] Assignee: Siemens Aktiengesellschaft, Berlin and Munich, Fed. Rep. of Germany

[21] Appl. No.: 524,443

[22] Filed: May 17, 1990

[30] Foreign Application Priority Data

May 30, 1989 [DE] Fed. Rep. of Germany ....... 3917538

[51] Int. Cl.$^5$ ................. H03K 17/30; H03K 19/17
[52] U.S. Cl. .................... 307/475; 307/446; 307/455; 307/451
[58] Field of Search ............ 307/475, 455, 451, 446, 307/570

[56] References Cited

U.S. PATENT DOCUMENTS

| | | | |
|---|---|---|---|
| 4,394,589 | 7/1983 | Pham et al. | 307/446 |
| 4,437,171 | 3/1984 | Hudson et al. | 365/177 |
| 4,475,050 | 10/1984 | Noufer | 307/475 |
| 4,490,632 | 12/1984 | Everett et al. | 307/446 |
| 4,896,059 | 1/1990 | Goodwin-Johansson | 307/451 |

OTHER PUBLICATIONS

High Performance Bipolar PMOS Logic Switching CKT J. Perris, Jr. et al., IBM Tech Disclosure, vol. 20 #1.

Hudson E. L. et al, "An ECL Compatible 4K CMOS RAM", IEEE International Solid-State Circuits Conference, 1982, pp. 248-249.

Primary Examiner—David Hudspeth
Assistant Examiner—Andrew Sanders
Attorney, Agent, or Firm—Hill, Van Santen, Steadman & Simpson

[57] ABSTRACT

A CMOS-ECL converter contains a drive stage modified from the prior art and a connected output transistor. The driver stage comprises a resistor element and an n-channel field effect transistor. The resistor element can preferably be constructed with the assistance of a p-channel field effect transistor and is connected in series with the n-channel field effect transistor. The advantage of such an arrangement is that the capacitive load at the input of the CMOS-ECL converter is low because the resistor element or, respectively, the p-channel field effect transistor, offers no contribution to such an input load. The channel width of the p-channel field effect transistor can be set such that an adequately-high base current for the bipolar output transistor can be supplied.

8 Claims, 1 Drawing Sheet

CMOS-ECL CONVERTER

BACKGROUND OF THE INVENTION

1. Field of the Invention:

The present invention relates to a complementary metal-oxide-semiconductor—emitter-coupled logic (CMOS-ECL) converter with a driver stage and an output transistor for the connection of a load, whereby an input of the CMOS-ECL converter is formed by an input of the driver stage and an output of the driver stage is connected to a control input of the output transistor, the drive stage being connected to a first terminal and to a second terminal for voltage supply, and the output transistor being connected between an output of the CMOS-ECL converter and the first terminal of the voltage supply, and wherein the driver stage contains at least one field effect transistor of the first conductivity type whose gate terminal is connected to the input of the driver stage and that is simultaneously connected between the output of the driver stage and the second terminal for the voltage supply.

2. Description of the Prior Art

ECL and CMOS circuits are widely used in semiconductor circuit technology. The ECL circuits have the shortest switching times of all logic families. These lie in the region of a few nanoseconds and, in part, also extend below one nanosecond. Complementary MOSFET transistors are utilized in CMOS circuits. The ohmic output load of the CMOS circuits is thereby extremely low because of the high input resistances. The switching time also becomes longer, the higher the capacitive output load. Given a greater capacitive output load, the switching time lies on the order of magnitude of about 10 nanoseconds and above.

In addition to MOS circuit technology, a bipolar CMOS (BICMOS) circuit technology has also been developed in recent years that is utilized particularly in time-critical and compact circuits. Advantages from the MOS circuit technology arise, as well as from the bipolar circuit technology, due to the utilization of BICMOS circuits. High packing densities and low static dissipated power that are characteristic, for example, of circuits from the CMOS circuit technology, a low offset voltage as well as an extremely high processing speed that are characteristic of circuits constructed in ECL or, respectively, bipolar circuit technology, are features that are favorable for the utilization of circuits in "BICMOS" circuit technology. Extremely high working speeds can definitely be achieved with the assistance of the "BICMOS" circuit technology, in that the circuit parts having higher processing speed are realized in ECL technology, but circuit parts less time-critical are realized in CMOS circuit technology.

Fast level converters or, respectively, output driver circuits are respectively required between these two circuit blocks.

FIG. 1 thereby illustrates a CMOS output driver in "BICMOS" circuit technology, and as is known in the art, that converts CMOS into the ECL level. It contains a driver stage with a following output transistor. As may be further seen from FIG. 1, the CMOS-ECL output driver has its input side connected to a internal chip CMOS standard inverter and has its output side terminated with an output load of 50 ohms. The matching between the internal chip CMOS standard inverter having low channel widths and the bipolar output transistor occurs here on the basis of a CMOS inverter to be suitable dimensioned as a driver stage. Although the base current to be supplied for the output transistor is adequately high given large MOS transistor widths of this driver, the internal chip CMOS standard inverter is simultaneously highly capacitively loaded before the driver stage.

SUMMARY OF THE INVENTION

It is therefore the object of the present invention to provide an ECL-CMOS converter in which the capacitive load of the circuits at the input side is optimally low.

The above object is achieved according to the present invention in a CMOS-ECL converter with a driver stage and an output transistor for the connection of an output load, wherein an input of the CMOS-ECL converter is formed by an input of the driver stage and an output of the driver stage is connected to a control input of the output transistor, wherein the driver stage is connected to a first terminal and to a second terminal for a voltage supply, in which the output transistor is connected between an output of the CMOS-ECL converter and the first terminal for the voltage supply and the driver stage contains at least one field effect transistor of a first conductivity type whose gate terminal is connected to the input of the driver stage and that is simultaneously connected between the output of the driver stage and the second terminal for the voltage supply, and is particularly characterized in that the driver stage contains a resistor element, and in that the resistor element is connected between the output of the driver stage and the first terminal for the voltage supply.

The advantages achieved in a circuit constructed in accordance with the present invention are that the processing times for converting the CMOS level into the ECL level are short, so that a gain in speed compared to CMOS-ECL converters of the prior art can be achieved by employing the circuit of the present invention.

A "BICMOS" process can thereby be utilized for manufacturing the CMOS-ECL converter, this supplying isolated npn bipolar transistors in addition to p-channel and n-channel MOS transistors. Such a technology made be derived from the German patent application of E. P. Jacobs and J. Winnerl, entitled "Verfahren zum gleichzeitigen Herstellen von bipolaren und komplemenaren MOS-Transistoren auf einem gemeinsamen Siliziumsubstrat".

According to a particular feature of the invention, the CMOS-ECL converter as set forth above is particularly characterized in that the resistor element is a field effect transistor of a second conductivity type whose gate terminal is connected to the second terminal for voltage supply.

According to another feature of the invention, the CMOS-ECL converter constructed in accordance with the present invention is particularly characterized in that the output transistor is an npn bipolar transistor, in that the control input represents a base terminal thereof and a collector terminal is connected to the first terminal for voltage supply and an emitter terminal is connected to the output of the CMOS-ECL converter.

According to another feature of the invention, the CMOS-ECL converter is particularly characterized in that an output load is connected between the output of the CMOS-ECL converter and a third terminal.

According to another feature of the invention, the CMOS-ECL converter of the present invention is particularly characterized in that the field effect transistor of the first conductivity type is an n-channel field effect transistor and the field effect transistor of a second conductivity type is a p-channel field effect transistor, in that the first terminal for a voltage supply is connected to a reference potential and the second terminal for a voltage supply and the third terminal are connected with a voltage that is negative in comparison to the reference potential, and in that the value of the voltage at the second terminal for voltage supply has a negative value in comparison to the voltage at the third terminal.

BRIEF DESCRIPTION OF THE DRAWING

Other objects, features and advantages of the invention, its organization, construction and operation will be best understood from the following detailed description, taken in conjunction with the accompanying drawings, on which.

DESCRIPTION OF THE PREFERRED EMBODIMENT

Figure 1:
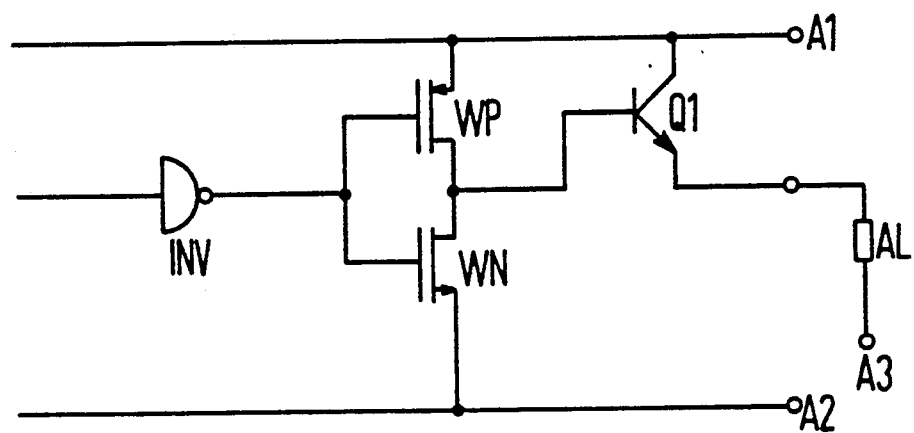
FIG. 1 is a schematic circuit diagram of a CMOS-ECL converter known in the art.

Driver circuits for converting CMOS level into ECL level are known in the art and, for example, are discussed in the article of Hudson, et al entitled "An ECL compatible 4K CMOS RAM", published in the ISSCC Digest of Technical Papers, Feb., 1982, p. 248, and in Hudson, et al, "ECL Compatible CMOS Memory", Intel, and U.S. Pat. No. 4,437,171, issued Mar. 13, 1984. Driver circuits constructed in accordance with "BIC-MOS" circuit technology are found in these publications, whereby FIG. 1 in the present application is taken from FIG. 3 of the Hudson, et al article entitled "ECL compatible 4K CMOS RAM". According to FIG. 1, the present CMOS-ECL converter contains a driver stage as well as an output transistor Q1 connected thereto. At its input side, the CMOS-ECL converter is connected with an inverter INV, whereas the output of the converter is terminated with an output load AL. The driver stage contains a p-channel and an n-channel field effect transistor WP, WN that form a common series circuit. A first terminal of this series circuit is connected to a first terminal A1 for a voltage supply and a second terminal of the series circuit is connected to a second terminal A2 for a voltage supply. In the present case, the first terminal A1 is to be connected with 0 volts and the second terminal A2 is to be connected to −5 volts. The gate terminal of the p-channel of the field effect transistor WP and the gate terminal of the n-channel of the field effect transistor WN, in common, form the input of the driver stage and simultaneously form the input of the CMOS-ECL converter. The internal chip standard inverter INV is connected thereto. The first terminal of the series circuit is connected to a first terminal of the p-channel field effect transistor WP and the second terminal of the series circuit is connected to a first terminal of the n-channel field effect transistor WN. The second terminal of the p-channel field effect transistor WP as well as the second terminal of the n-channel field effect transistor WN, in common, form the output of the driver stage and are to be connected to the control input (base terminal) of the output transistor Q1. The output transistor Q1 itself is arranged between the first terminal A1 for a voltage supply and the output of the CMOS-ECL converter, so that the collector terminal of the transistor Q1' is connected to the terminal A1 and the emitter terminal of the transistor Q1' is connected to the output of the converter. The output transistor Q1 of FIG. 1 is constructed as an non bipolar transistor by way of which an output load AL having a characteristic impedance of 50 ohms is connected to a third terminal A3. The third terminal A3 is thereby to be connected to a voltage of −2 volts. The output load AL arises, for example, due to the input stage of a following circuit including the feeders required therefor. The matching between the internal chip CMOS standard inverter INV with low channel widths of, for example, 10 μm/5 μm for the p-channel or, respectively, n-channel field effect transistor of the standard inverter and the bipolar output transistor Q1 occurs here with a CMOS inverter as a driver stage to be suitably dimensioned. Although, as already set forth, the base current to be supplied is adequately high for the output transistor Q1 given greater MOS transistor widths of this driver, the internal chip standard inverter INV is simultaneously highly capacitively loaded before the driver stage.

CMOS levels between 0 and 5 volts are applied to the input of the CMOS-ECL converter and are converted into an ECL level or approximately −2 volts for a low signal and −1.2 volts for a high signal. When a signal that falls below approximately −2.5 volts is applied to the input of the CMOS-ECL converter, then the p-channel field effect transistor WP becomes conductive and the n-channel field effect transistor WN of the driver stage inhibits. The further result thereof is that the output transistor Q1 is conductive and an output signal is fed by way of the output load AL. The time interval in which the two field effect transistors of the drive stage switch and in which the output transistor Q1 is placed into the conductive condition is referred to as delay time. Given a suitable selection of the transistor widths of the driver of, for example, 50 μm for the p-channel field effect transistor and 5 μm for the n-channel field effect transistor, the delay time between the input and output of the transistor can lie in the region of 1.65 nanoseconds. When the voltage level at the input of the CMOS-ECL converter exceeds a voltage value of −2.5 volts, then the opposite effect occurs and the n-channel field effect transistor WN becomes conductive whereas the p-channel field effect transistor WP inhibits. In this case, the output transistor Q1 is also inhibited and a voltage of −2 volts is applied to the output of the CMOS-ECL converter.

Figure 2:
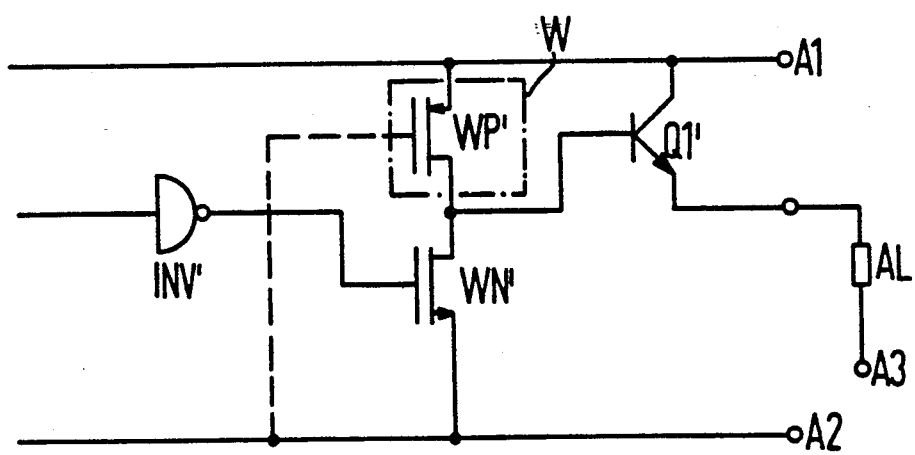
FIG. 2 is a schematic circuit diagram of a CMOS-ECL converter constructed in accordance with the present invention.

The following particulars for the channel widths of the field effect transistors can be considered an example of dimensioning. For the internal chip standard inverter INV, a channel width of 10 μm can be stated for the p-channel field effect transistor and a channel width of 5 μm can be stated for the n-field effect transistor (neither of the field effect transistors of the internal chip standard inverter are shown in FIG. 1, but rather the logic symbol therefor). For the drive stage, 50 μm can be selected as the channel width for the p-channel field effect transistor and 5 μm can be selected for the n-channel field effect transistor. A delay time of approximately 1.65 nanoseconds, given a maximum frequency of 220 MHz results therefrom. The output load AL should have a value of 50 ohms, so that the voltage drop U via the output load amounts to 800 mv. Assume the channel length of the MOS transistors is prescribed to be 1.5 μm and the transit frequency of the bipolar transistor to be 3.5 GHz (dependent on technology). The widths and lengths of the bipolar transistor are to be matched to the maximum load current and are the same for both circuits (FIGS. 1 and 2). The stated delay times or, respectively, maximum frequency refer to a specific BICMOS technology, as set forth in the aforementioned German patent application.

FIG. 2 is a schematic circuit diagram of a realization of the CMOS-ECL converter constructed in accordance with the present invention and that differs from the CMOS-ECL converter of the prior art of FIG. 1 on the basis of a different design of the driver stage. Just as in FIG. 1, the CMOS-ECL converter contains a driver stage having a bipolar output transistor Q1' connected thereto. In this case, the driver stage is formed of a resistor element W and of an n-channel field effect transistor WN'. Both, again, form a series circuit, whereby a first terminal of the series circuit is connected to the first terminal A1 for voltage supply and a second terminal of a series circuit is connected to the second terminal A2 for voltage supply. The first terminal of the series circuit thereby simultaneously represents the first terminal of the resistor element W, whereas the second terminal of the series circuit is formed by a first terminal of the n-channel field effect transistor WN'. The second terminal of the resistor element W and the second terminal of the n-channel field effect transistor WN', in common, form the output of the driver stage that is connected to the control input (base terminal) of the bipolar transistor Q1'. An inverter INV' is again connected to the input of the CMOS-ECL converter in this case. The matching of this likewise internal chip standard inverter INV' and the bipolar output transistor Q1' occurs with the assistance of the above-described driver stage, whereby only the n-channel field effect transistor WN' forms the input of the driver stage.

A p-channel field effect transistor WP', whose gate terminal is to be connected to the second terminal A2 for voltage supply and whose first and second terminals represent the first and second terminals of the resistor element W, is particularly suited as a resistor element W. As in FIG. 1, the first and second terminal points A1, A2 for voltage supply are thereby respectively connected to voltage values of 0 or, respectively, −5 volts.

The advantage of this arrangement resides in the fact that the capacitive load on the CMOS-ECL converter input is low because the resistor element W or, respectively, the p-channel field effect transistor WP', contributes nothing to the input load. As in FIG. 1, the bipolar output transistor Q1' is connected between the first terminal A1 for voltage supply and the output of the CMOS-ECL converter, whereby an output load AL of 50 ohms with a third terminal A3 is again connected to its output. The third terminal A2 is to be connected to a voltage having a value of −2 volts, just as in FIG. 1. In the CMOS-ECL converter constructed in accordance with the present invention, the value of resistance of the resistance element W or, respectively, the channel width of the p-channel field effect transistor WP' can be set such that an adequetely-high base current can be supplied for the bipolar output transistor Q1'. Since the dissipated power of the overall arrangement is defined by the required voltage drop via the output load AL, a higher dissipated power in comparison to the CMOS drivers is of no concern here.

The described, advantageous design of the driver stage can also be appreciated when, in addition to this, a different input or, respectively, output connection of the driver is present.

The following particulars can again be viewed as being a dimensioning example for a realization of the CMOS-ECL output driver constructed in accordance with the present invention. The inverter dimensioning INV' of the field effect transistor can be undertaken analogous to that in FIG. 1, so that a channel width of 10 μm is adequate for the p-channel field effect transistor and a channel width of 5 μm is adequate for the n-channel field effect transistor. A channel width of 20 μm can be stated for the n-channel field effect transistor WN' and, given a realization of the resistor element W by a p-channel field effect transistor WP', the channel width thereof should lie at about 60 μm. A delay time of approximately 1.0 nanoseconds derives therefrom, so that a gain in speed of 60% compared to the CMOS-ECL converter of FIG. 1 can be achieved. Now assume 350 MHz to be the maximum possible use frequency. Analogous to FIG. 1, the output load AL' amounts to 50 ohms, as a result whereof a voltage drop of approximately 800 millivolts is produced at the output load. Assume the channel length of the MOS transistors to be prescribed at 1.5 μm and the transit frequency of the bipolar transistor be prescribed at 3.5 GHz (again, dependent on technology). The recited delay times or, respectively, maximum frequencies again refer to a specific BICMOS technology (see the German application No. P 35 19 790.0).

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. In a CMOS-ECL converter of the type which includes a driver stage with an input and an output, and an output transistor, in which the converter includes an input formed of the input of the driver, and a converter output, in which the output transistor includes a control input connected to the output of the driver stage, in which the driver stage is connected to first and second terminals for voltage supply and the output transistor is connected between the output of the converter and the first terminal for voltage supply, and in which the driver stage comprises at least one field-effect transistor of a first conductivity type including a gate connected to the input of the driver stage, wherein:
   the driver stage comprises a resistor element connected between the output of the driver stage and the first terminal for voltage supply.

2. The improved CMOS-ECL converter of claim 1, wherein:
   said resistor element comprises a further field-effect transistor of a second conductivity type including a gate connected to the second terminal for voltage supply.

3. The improved CMOS-ECL converter of claim 2, and further comprising:
   a third terminal for voltage supply; and an output load connected between the output of the CMOS-ECL converter and the third terminal for voltage supply.

4. The improved CMOS-ECL converter of claim 2, wherein:
the at least one field effect transistor of the first conductivity type comprises an n-channel field-effect transistor; and
said further field-effect transistor of a second conductivity type is a p-channel field-effect transistor.

5. The improved CMOS-ECL converter of claim 4, wherein:
the output transistor is an npn bipolar transistor including a base forming the control input, a collector connected to the first terminal for voltage supply and an emitter connected to the output of the CMOS-ECL converter.

6. A CMOS-ECL converter comprising:
an input, an output, and first and second terminals for voltage supply;
first and second field-effect transistors of respective opposite first and second conductivities, each of said field-effect transistors including a controlled current path and a gate, said gate of said first field-effect transistor connected to said input, said controlled current paths connected in series between said first and second terminals for voltage supply, and said gate of said second field-effect transistor connected to the second terminal for voltage supply; and
a bipolar output transistor including a base connected to the junction of said controlled current paths of said first and second field-effect transistors, a collector connected to the first terminal for voltage supply, and an emitter connected to said output.

7. A CMOS-ECL converter comprising:
an input, an output, and first and second terminals for voltage supply;
first and second field-effect transistors, said first field-effect transistor being an n-channel field-effect transistor and said second field-effect transistor being a p-channel field effect transistor, each of said field-effect transistors including a controlled current path and a gate, said gate of said first field-effect transistor connected to said input, said controlled current paths connected in series between said first and second terminals for voltage supply, said gate of said second field-effect transistor connected to the second terminal for a voltage supply; and
an npn bipolar output transistor including the base connected to the junction of said controlled current paths of said first and second field-effect transistors, a collector connected to the first terminal for a supply, and an emitter connected to said output.

8. A CMOS-ECL converter comprising:
an input, an output, and first, second and third terminals for voltage supply;
said first terminal connected to a reference potential, said third terminal connected to a potential that is negative with respect to the reference potential, and said second terminal connected to a potential that is negative with respect to the voltage potential at said third terminal;
first and second field-effect transistors, said first field-effect transistor being an n-channel field-effect transistor and said second field-effect transistor being a p-channel field effect transistor, each of said field-effect transistors including a controlled current path and a gate, said gate of said first field effect transistor connected to said input, said controlled current paths connected in series between said first and second terminals for voltage supply, and said gate of said second field-effect transistor connected to the second terminal for voltage supply;
an npn bipolar output transistor including a base connected to the junction of said controlled current paths of said first and second field-effect transistors, a collector connected to the first terminal for a voltage supply, and an emitter connected to said output; and
a load connected between said output and said third terminal for voltage supply.

* * * * *